US009570385B2

(12) United States Patent
Lee et al.

(10) Patent No.: US 9,570,385 B2
(45) Date of Patent: Feb. 14, 2017

(54) METHOD FOR FABRICATION OF INTERCONNECTION CIRCUITRY WITH ELECTRICALLY CONDUCTIVE FEATURES PASSING THROUGH A SUPPORT AND COMPRISING CORE PORTIONS FORMED USING NANOPARTICLE-CONTAINING INKS

(71) Applicant: Invensas Corporation, San Jose, CA (US)

(72) Inventors: Bong-Sub Lee, Mountain View, CA (US); Cyprian Emeka Uzoh, San Jose, CA (US); Charles G. Woychik, San Jose, CA (US); Liang Wang, Milpitas, CA (US); Laura Wills Mirkarimi, Sunol, CA (US); Arkalgud R. Sitaram, Cupertino, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/602,984

(22) Filed: Jan. 22, 2015

(65) Prior Publication Data

US 2016/0218057 A1    Jul. 28, 2016

(51) Int. Cl.
*H05K 3/02*    (2006.01)
*H05K 3/10*    (2006.01)
(Continued)

(52) U.S. Cl.
CPC ....... *H01L 23/49838* (2013.01); *H01L 21/486* (2013.01); *H01L 21/4857* (2013.01); *H01L 21/4867* (2013.01); *H01L 23/49822* (2013.01); *H01L 23/49827* (2013.01); *H05K 1/112* (2013.01); *H05K 1/165* (2013.01); *H05K 3/188* (2013.01); *H01L 2224/16225* (2013.01);
(Continued)

(58) Field of Classification Search
CPC ............... H01L 2224/11; B22F 1/0018; Y10T 29/49117; Y10T 29/49124; Y10T 29/49126; Y10T 29/49155; Y10T 428/12181
USPC .... 29/846, 825, 829, 848, 874, 884; 257/44, 257/47, 54; 347/686, 697, 762, 777, E21.502
See application file for complete search history.

(56) References Cited

U.S. PATENT DOCUMENTS

| 4,954,313 A | 9/1990 | Lynch |
| 7,141,617 B2 | 11/2006 | Gratson et al. |

(Continued)

FOREIGN PATENT DOCUMENTS

| GB | 2418918 A | 4/2006 |
| WO | WO 2009/011709 A1 | 1/2009 |

(Continued)

OTHER PUBLICATIONS

International Search Report and Written Opinion in PCT/US2016/014450, mailed Apr. 11, 2016. 11 pages.
(Continued)

*Primary Examiner* — Thiem Phan
(74) *Attorney, Agent, or Firm* — Haynes and Boone, LLP

(57) ABSTRACT

Interposer circuitry (130) is formed on a possibly sacrificial substrate (210) from a porous core (130') covered by a conductive coating (130") which increases electrical conductance. The core is printed from nanoparticle ink. Then a support (120S) is formed, e.g. by molding, to mechanically stabilize the circuitry. A magnetic field can be used to stabilize the circuitry while the circuitry or the support are being formed. Other features are also provided.

10 Claims, 11 Drawing Sheets

(51) Int. Cl.
*H01L 23/498* (2006.01)
*H01L 21/48* (2006.01)
*H05K 1/11* (2006.01)
*H05K 1/16* (2006.01)
*H05K 3/18* (2006.01)

(52) U.S. Cl.
CPC ............... *H01L 2924/0002* (2013.01); *H01L 2924/15192* (2013.01); *H01L 2924/15311* (2013.01); *Y10T 29/49117* (2015.01); *Y10T 29/49124* (2015.01)

(56) References Cited

U.S. PATENT DOCUMENTS

| | | | |
|---|---|---|---|
| 7,249,559 B2 | 7/2007 | McNeil | |
| 7,391,121 B2 | 6/2008 | Otremba | |
| 7,434,912 B2 * | 10/2008 | Murata | B05B 5/0255 347/44 |
| 7,678,685 B2 | 3/2010 | Sunohara et al. | |
| 7,774,920 B2 | 8/2010 | Deng et al. | |
| 7,790,061 B2 | 9/2010 | Gratson et al. | |
| 7,793,414 B2 | 9/2010 | Haba et al. | |
| 7,922,939 B2 | 4/2011 | Lewis et al. | |
| 9,061,494 B2 * | 6/2015 | Rogers | B41J 2/06 |
| 2006/0032670 A1 | 2/2006 | Haba et al. | |
| 2010/0237495 A1 | 9/2010 | Pagaila et al. | |
| 2011/0187798 A1 | 8/2011 | Rogers et al. | |
| 2013/0059402 A1 | 3/2013 | Jakob et al. | |
| 2013/0313716 A1 | 11/2013 | Mohammed | |
| 2014/0036454 A1 | 2/2014 | Caskey et al. | |
| 2014/0263582 A1 | 9/2014 | Uzoh | |
| 2014/0322451 A1 | 10/2014 | Barton et al. | |

FOREIGN PATENT DOCUMENTS

| | | |
|---|---|---|
| WO | WO 2010/028712 | 3/2010 |
| WO | WO 2010/028712 A1 | 3/2010 |

OTHER PUBLICATIONS

B.Y. Ahn et al., "Planar and Three-Dimensional Printing of Conductive Inks", J. Vis. Exp. (58), e3189, doi:10.3791/3189 (2011).

S. Jeong et al., "Air-stable, surface-oxide free Cu nanoparticles for highly conductive Cu ink and their application to printed grapheme transistors", J. Mater. Chem. C, 1, 2704-2710, 2013.

J-U. Park et al., "Nanoscale, Electrified Liquid Jets for High-Resolution Printing of Charge", Nano Lett., 10, 584-591, 2010.

R. Cauchois et al., Chip integration using inkjet-printed silver conductive tracks reinforced by electroless plating for flexible board packages. MiNaPAD 2012. Micro/Nano-Electronics Packaging & Assembly, Design and Manufacturing Forum, Apr. 2012, Grenoble, France. pp. F01. <emse-00691806>.

U.S. Appl. No. 14/489,358, filed Sep. 17, 2014.

* cited by examiner

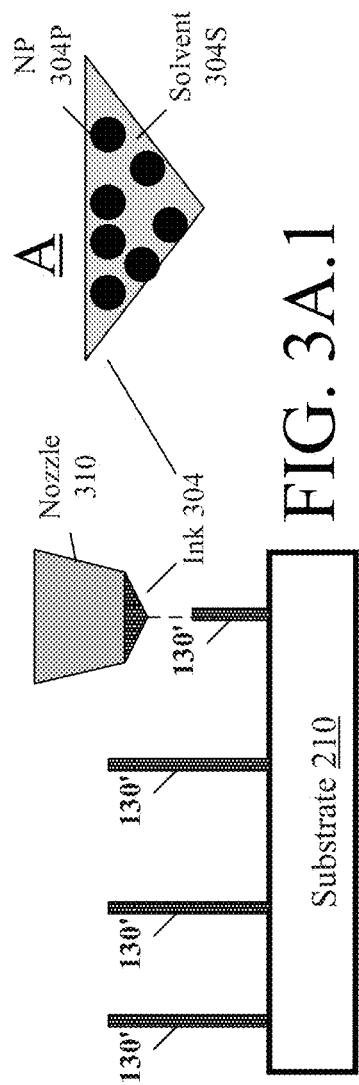
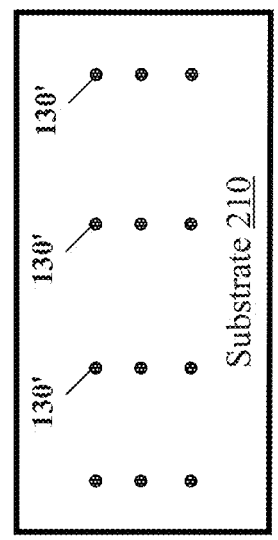
FIG. 3A.1
FIG. 3A.2

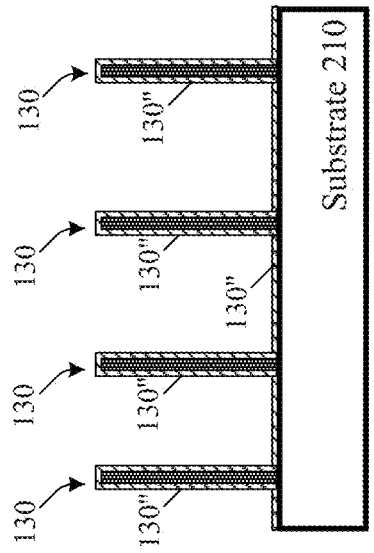
FIG. 3B.1
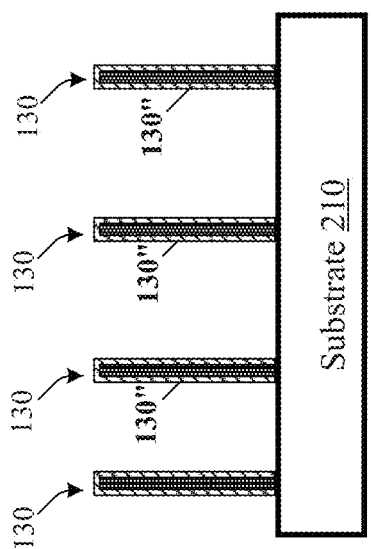
FIG. 3B.2
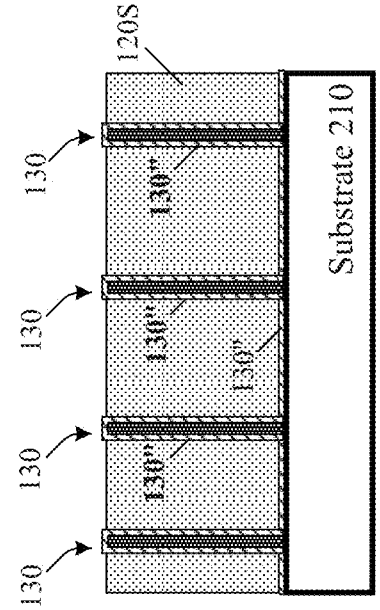
FIG. 3C.1
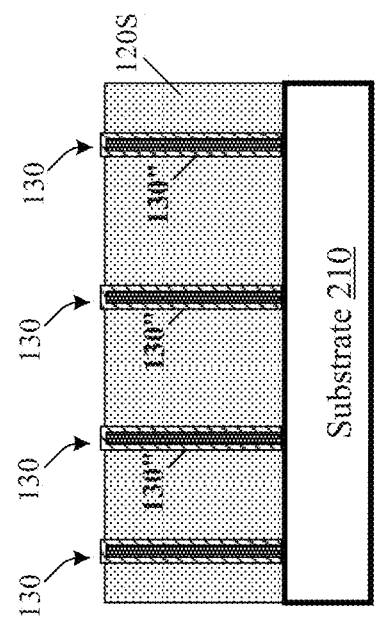
FIG. 3C.2

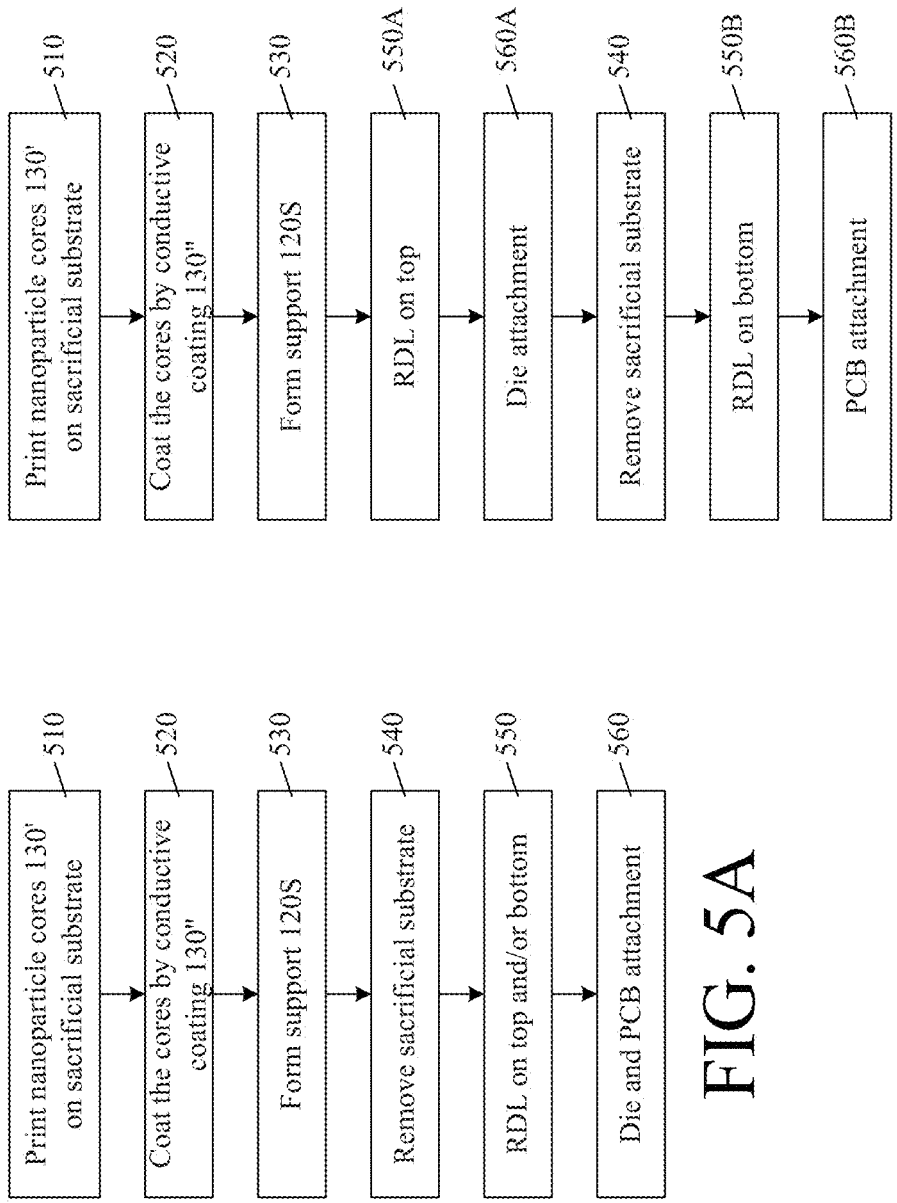

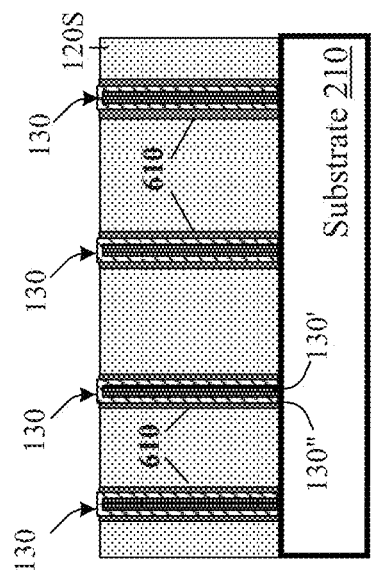
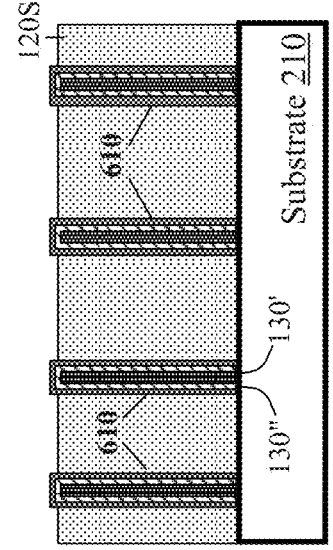
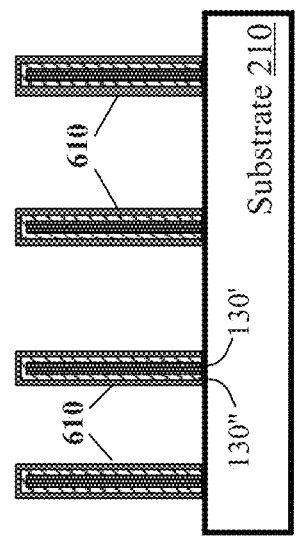
FIG. 6A
FIG. 6B
FIG. 6C

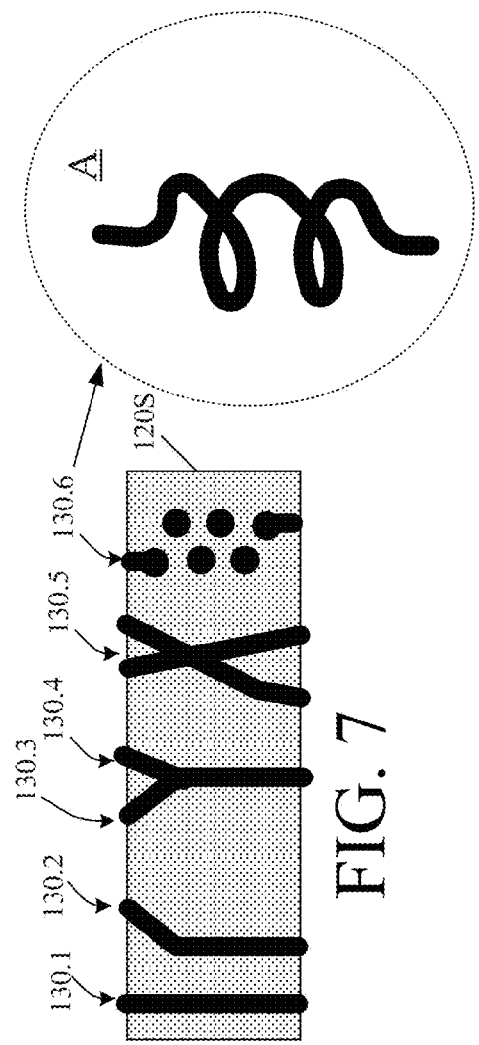
FIG. 7
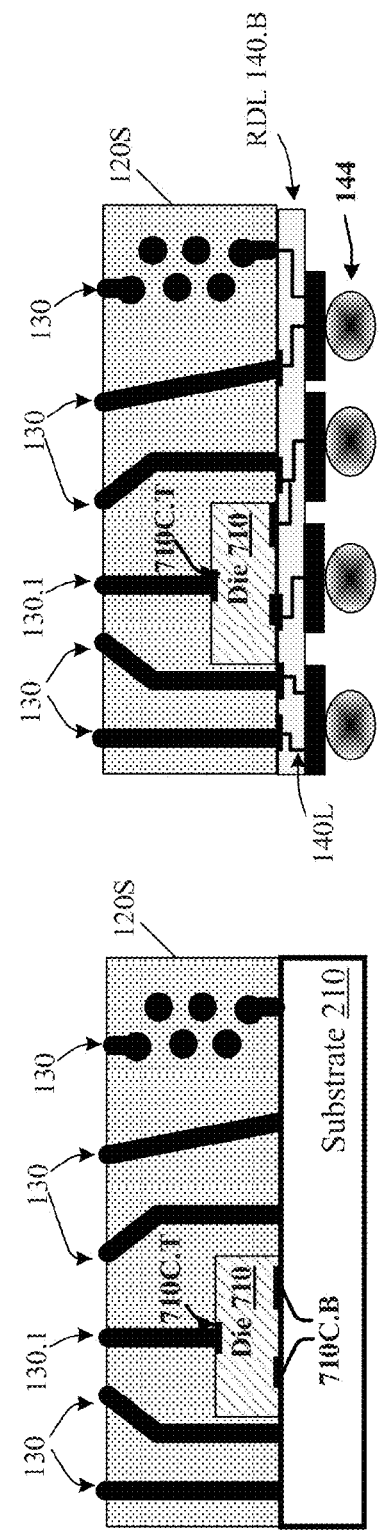
FIG. 8A
FIG. 8B

METHOD FOR FABRICATION OF INTERCONNECTION CIRCUITRY WITH ELECTRICALLY CONDUCTIVE FEATURES PASSING THROUGH A SUPPORT AND COMPRISING CORE PORTIONS FORMED USING NANOPARTICLE-CONTAINING INKS

BACKGROUND OF THE INVENTION

The present invention is directed to integrated circuits, and more particularly to interconnection of integrated circuits and other components.

An integrated circuit (IC) is a small device with tiny contact pads that must be connected to other circuitry to form a complete system. ICs and other circuits are often interconnected through intermediate substrates such as printed circuit boards (PCBs) or interposers. An IC's contact pads can be connected to the substrate's contact pads by discrete wires. However, to reduce the size of the assembly and shorten the electrical paths, the discrete wires can be eliminated, as illustrated in FIG. 1.

FIG. 1 shows two ICs 110.1, 110.2 connected to each other and possibly to other circuits through an interposer 120 and a PCB 124. In this example, each IC 110 (i.e. 110.1 and 110.2) is a "die" (also called "chip"), i.e. it is initially manufactured in a semiconductor wafer (not shown) together with other ICs, and the wafer is then cut up to separate the ICs. The interposer includes a support 120S with conductive vias 130 passing through the support. The interposer also includes a redistribution layer (RDL) 140 with conductive lines 140L insulated from each other by dielectric 140D. (The conductive lines may be arranged as one or more conductive layers; if there is only one conductive layer, the conductive lines can be horizontal, without vertical portions.) The dies' contact pads 110C are attached to contact pads 120C.T provided at the top of RDL 140.T. The connections are shown at 144, and can be solder, adhesive, diffusion bonding, or some other type. Discrete wires can also be used. The RDL's conductive lines 140L interconnect the contact pads 120C.T and the vias 130. The vias terminate at the bottom at contact pads 120C.B. Contact pads 120C.B are attached to the PCB's contact pads 124C with other connections 144, e.g. solder or adhesive or diffusion bonding. The PCB may include other contact pads connected to other circuits (ICs, interposers, or other components, not shown). The PCB's conductive lines 124L interconnect the PCB's contact pads 124C as needed.

PCB 124 and interposer 120 absorb and dissipate some of the heat generated by the die and thus reduce thermal stresses (mechanical stresses resulting from thermal expansion). Also, if the interposer's coefficient of thermal expansion (CTE) is intermediate between the PCB and the die, then the interposer may alleviate some of the stresses arising from the CTE mismatch between the die and the PCB. Further, the PCB manufacturing technologies may not allow the PCB contact pads 124C to be as densely packed as the die's contact pads 110C, and in this case the interposer 120 serves to "redistribute" the contact pads, i.e. provide the interconnection despite the positional mismatch between the die's and PCB's contact pads.

The vias 130 can be formed by depositing metal into through-holes made in support 120S. However, it is often preferred that the through-holes be narrow (in order to reduce the lateral area of the structure), and metal deposition into narrow holes is complicated, resulting possibly in metal discontinuities and voids which impair electrical conductivity and reliability. To address this problem, the fabrication process can be reversed: vias 130 can be initially formed as free-standing posts on a sacrificial substrate 210 (FIG. 2A), and these posts can then be inserted into through-holes 148 in a separate support 120S (FIGS. 2A, 2B). Substrate 210 can then be removed (FIG. 2C). See U.S. Pat. No. 7,793,414 issued Sep. 14, 2010 to Haba et al. Posts 130 can be formed by deposition and etch or by a selective deposition process. Selective deposition processes include electroplating, chemical vapor deposition (CVD), evaporation, sputtering, and printing.

It is desirable to provide improved processes and materials for forming interconnections.

SUMMARY

This section summarizes some features of the invention. Other features may be described in the subsequent sections. The invention is defined by the appended claims, which are incorporated into this section by reference.

In some embodiments of the present invention, the vias 130 are manufactured as free-standing posts similarly to FIG. 2A, possibly by using novel techniques described below. Also, vias 130 can be replaced by other types of free-standing circuitry including, for example, conductive lines with vertical, horizontal, and inclined segments extending in any desired direction. Such circuitry may facilitate contact-pad redistribution, possibly eliminating or simplifying the RDL 140. Also, the circuitry may include coils and other shapes to provide inductors, capacitors, and possibly other circuit elements.

In some embodiments, such circuitry is made by printing of nanoparticle inks. A nanoparticle ink includes sub-micron-size conductive particles (e.g. copper, silver, or some other metal) dispersed in a liquid or semisolid carrier ("solvent"). Nanoparticle ink can be deposited onto a substrate (such as 210 in FIG. 2A) from a nozzle (or multiple nozzles, not shown) drop by drop or in a continuous flow. The ink can be forced out of the nozzle by mechanical pressure (e.g. by air pressure, or piezoelectrically, or by thermal pulses); or electrostatically (in electrohydrodynamic printing). See e.g. U.S. pre-grant patent publications 2011/0187798 A1 (Rogers et al.), 2013/0059402 (Mar. 7, 2013; Jakob et al.), and 2014/0322451 (Oct. 30, 2014; Barton et al.); PCT publications WO 2009/011709 A1 and WO 2010028712 A1; U.S. Pat. No. 7,922,939 B2 (Apr. 12, 2011; Lewis et al.); Ahn et al., "Planar and Three-Dimensional Printing of Conductive Inks", J. Vis. Exp. (58), e3189, doi:10.3791/3189 (2011); U.S. Pat. No. 7,141,617 (Gratson et al., Nov. 28, 2006); UK patent application no. 2 481 918 (12 Apr. 2006); and U.S. Pat. No. 7,790,061 (Sep. 7, 2010, Gratson et al.); all incorporated herein by reference. Nanoparticle ink printing was also disclosed at an oral presentation by Heejoo Lee and Jang-Ung Park, "High-Resolution Printing of Three-Dimensional Structures by Electrohydrodynamic Inkjet Printing Using Multiple Functional Inks", presented at 2014 Materials Research Society Spring Meeting, San Francisco, Apr. 23, 2014.

When deposited on a substrate (such as 210), the conductive nanoparticles are held together (by van der Waals or other forces) to provide a wire or other feature, and the solvent partially or completely evaporates. Further, the nanoparticles can be sintered together, e.g. by heat. In some embodiments, the sintering temperature is quite low, well below the melting temperature for the corresponding bulk materials, due to the nanoparticles' high surface energy. For example, copper nanoparticles can be sintered at 200 to 300° C. or even below 200° C. This printing process can provide thin, strong, conductive wires, having down to sub-micron diameter and a high aspect ratio (the aspect ratio is the ratio of the wire length to the wire diameter). The wires do not have to be vertical but can be inclined at any angle, and can form inductor coils or other structures as needed.

After printing the wires, support 120S can be formed as a dielectric layer encapsulating the wires. The dielectric can be formed for example from a flowable (liquid or semisolid) material such as epoxy or glass or any suitable molding compound, or by chemical vapor deposition (CVD) or physical vapor deposition (CVD). See U.S. pre-grant patent publication US 2014/0036454 A1 (Caskey et al., Feb. 6, 2014) entitled "BVA Interposer", sharing common inventors and assignee with the present application.

The inventors observed that even after sintering, the wires made from nanoparticle inks can be highly porous, and hence may have relatively high electrical resistance especially if the wires are thin (thin wires are desirable for high packing density). In some embodiments, the porosity can be as high as 40% or higher (especially before sintering). The wires' conductivity can be quite low even after sintering due in part to the porosity and in part to the resistive junctures between the adjacent particles. Therefore, in some embodiments, before the dielectric deposition, the wires are coated with a conductive coating (e.g. metal) to increase electrical conductivity. In some embodiments, the coating material is less porous, and/or has a higher electrical conductivity, than the material of the printed wires.

In some embodiments, an electrically insulating coating is formed over the conductive coating to insulate the wires from support 120S. In this case, support 120S can be made of a non-electrically insulating material, possibly conductor or semiconductor. An insulating material can also be used. Thus, a greater choice of materials becomes available for support 120S, as needed for CTE matching, rigidity, or other properties.

Some embodiments do not use nanoparticle inks to print coils or other circuit elements.

Another problem addressed by some embodiments of the present invention relates to maintaining the wires' shape during fabrication of support 120S: if the wires bend, it may be impossible to connect them to dense overlying features (such as die's contact pads 110C or RDL lines 140L). Therefore, in some embodiments, the wire shape is maintained by an external magnetic field. The wires' printed core or the coating may include magnetic materials (ferromagnetic materials such as nickel, cobalt or iron, or ferrimagnetic materials such as ferrites or magnetic garnets), to enable magnetic control of the wire shapes. The magnetic field can be used with any free-standing wires or other circuit elements, not necessarily with wires made from nanoparticle inks, and even with wires made by techniques other than printing.

The invention is not limited to the features and advantages described above except as defined by the appended claims.

BRIEF DESCRIPTION OF THE DRAWINGS

FIG. 3A.2 is a top view of a structure shown in FIG. 3A.1 according to some embodiments of the present invention.

FIGS. 5A, 5B are flowcharts of fabrication processes according to some embodiments of the present invention.

FIGS. 6A, 6B, 6C, 7, 8A, 8B, 9, 10, 11, 12 are vertical cross sections of structures with interposers in the process of fabrication according to some embodiments of the present invention.

DESCRIPTION OF SOME EMBODIMENTS

Figure 1:
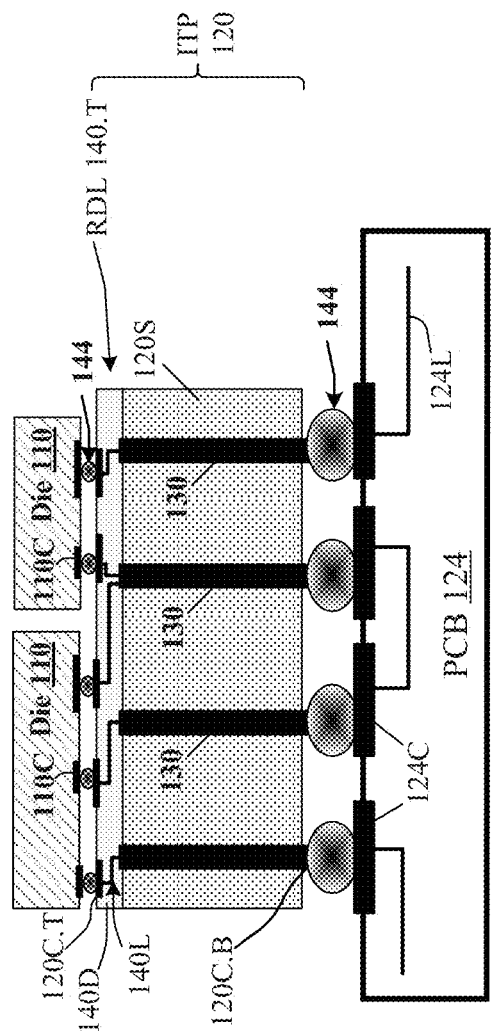
FIG. 1 is a vertical cross section of an integrated circuit assembly with an interposer according to prior art.

The embodiments described in this section illustrate but do not limit the invention. The invention is defined by the appended claims.

Below, the terms "conductivity", "conductive", "conductor", etc. refer to electrical conductivity unless stated otherwise. Similarly, "resistivity" relates to electrical resistivity, and "insulation" refers to electrical insulation, unless stated otherwise. "Dielectric" denotes any electrically insulating material, not necessarily with a high dielectric constant.

FIGS. 3A.1 (vertical cross section), 3A.2 (top view) illustrate printing of wire cores 130' from nanoparticle ink 304 onto substrate 210 in some embodiments of the present invention. Cores 130' are the core parts of wires 130. The printing can use conventional technology described in references cited above, or other technology. In the embodiment shown, ink 304 is dispensed from a nozzle 310 by suitable forces, e.g. electrostatic or mechanical pressure (the mechanical pressure can be generated by heat, gas pressure, piezoelectrically, or possibly in other ways). Ink 304 includes a suspension of conductive nanoparticles ("NP") 304P in a solvent 304S as shown in insert A. Particles 304P are schematically shown as circles (spheres), but they may have arbitrary three-dimensional, possibly irregular shapes. Particles 304P are of sub-micron sizes, sufficiently small to sinter at a desired low temperature (e.g. 300° C. or less). For example, in some copper nanoparticle embodiments, the copper particle size is below 0.5 microns, and most particles have a size below 108 nm; see e.g. Sunho Jeong et al., "Air-stable, surface-free Cu for highly conductive Cu ink and their application to printed transistors", J. Mater. Chem. C, 2013, 1, 2704-2710, incorporated herein by reference, describing an ink with a copper particle sizes having a bimodal distribution with 42 nm and 108 nm peaks. Particles 304P can be any suitable electrically conductive material, e.g. metal or metal alloy, and the metal can be copper, silver, nickel, cobalt, iron, tin, solder, or some other type. Particles 304P can also be non-metallic conductors, e.g. carbon (such as graphite or carbon black (such as acetylene black)), conductive ceramics (e.g. indium tin oxide or titanium nitride), conductive polymers (e.g. polypyrrole).

The solvent 304S can be any solvent described in the references cited above. Other nanoparticle ink materials, known or to be invented, may also be suitable for the interposer fabrication processes described below.

Substrate 210 can be any material consistent with subsequent processing and operation. For example, in some embodiments, substrate 210 will be removed during fabrication, and the substrate material can be chosen to facilitate easy removal. If fabrication involves high temperatures, then the substrate material can be chosen to have a CTE identical or similar to the CTE of other components (e.g. 304P, 120S, and others). The substrate material should enable adequate adhesion of cores 130' to the substrate. Substrate 210 can be conductive, dielectric, or semiconductor. Exemplary conductive materials are the same as given above for particles 304P. Exemplary semiconductors are monocrystalline, polycrystalline, or amorphous silicon. Exemplary dielectrics are silicon dioxide, silicon nitride, polyimide, epoxy. Both organic and inorganic materials can be used; composite materials are possible. Substrate 210 can be rigid, semi-rigid, or flexible as desired. Rigid materials are sometimes preferred as they can be precisely positioned and can be easily handled by robots; on the other hand, flexible materials are preferred for reel-to-reel processing.

Substrate 210 can be a laminate of multiple layers of the same or different materials. A part (possibly all) of the top layer can be electrically conductive to enable subsequent electroplating of conductive coating on cores 130' as discussed below.

Nozzle 310 moves from one wire location to the next, or substrate 210 is moved under the nozzle, or both are moved as needed. The nozzle and the substrate can also move vertically relative to each other (e.g. the nozzle moves while the substrate is stationary, or the substrate moves when the nozzle is stationary, or both move). The nozzle and/or substrate movement can be effected by hand or, more typically, automatically (possibly controlled by a computer pre-programmed with the desired locations and heights of cores 130', with parameters that define the ink dispensing, and possibly other operational parameters). The ink can be dispensed drop-by-drop or continuously (continuous dispensing can be interrupted if needed while moving the nozzle relative to the substrate).

In FIG. 3A.2, the cores 130' form an array, but this is a non-limiting example as the wires can be at any locations. The cores are shown circular in top view, but they may be oval or have other shapes. A core may have a varying horizontal cross section, e.g. a core may be wider at the bottom than at the top or vice versa. For example, the bottom portion of a core may be formed by larger ink drops than the top portion, or by two laterally adjacent ink drops versus a single drop at each horizontal level for the top. Different cores may have different shapes and dimensions in the same interposer. Also, while the cores are shown as vertical, they can be of any shape as discussed below.

In some embodiments, each core's diameter (maximum dimension in top view) is 50 nm to 50 μm; the pitch (the minimum core/space distance, or the minimum distance between the centers of adjacent cores) is 100 nm to 100 μm; the core's height is up to 2 mm; the aspect ratio (height to diameter) is 3:1 to 50:1. The aspect ratio is limited by the need to keep the wires rigidly positioned in later processing, but this requirement can be relaxed (and hence the aspect ratio can be increased) if magnetic fields are applied as described below. The effective aspect ratio can be further increased by stacking multiple interposers on top of one another as described below in connection with FIG. 10.

The pitch can also be limited by the nozzle 310 diameter if the nozzle's bottom is at a lower height than the adjacent already-printed cores 130' (as shown in FIG. 3A.1). However, if the nozzle is higher than the cores during printing, then the nozzle diameter may be non-limiting with respect to the pitch.

In some embodiments, multiple nozzles are used in parallel to print respective different wires. For example, one wire array can be printed by one nozzle while another wire array can be simultaneously printed by another nozzle. The nozzles can be spaced from each other by a greater distance than adjacent wires.

The structure is processed (e.g. heated) to sinter the nanoparticles 304P in each core 130'. Conventional sintering processes can be used. In some embodiments, the solvent completely or entirely evaporates before and/or during sintering.

A conductive coating 130" is formed on cores 130' as shown in FIG. 3B.1 or 3B.2. Both figures show vertical cross sections. In FIG. 3B.1, the coating 130" is formed on cores 130' only. In FIG. 3B.2, coating 130" is also formed between the cores. Coating 130" has a lower porosity than cores 310', possibly zero porosity. Coating 130" is substantially conformal: it does not bridge the adjacent cores 130" to allow the cores to be electrically insulated from each other if needed.

In some embodiments, coating 130" is a higher electrical conductivity material than cores 130' due to the chemical composition and/or porosity and/or other properties of these materials. For example, coating 130" can be copper, iron, nickel, cobalt, silver, palladium, or some other metal, or their alloys, deposited to a thickness of 100 nm or some other thickness as needed to obtain the desired low resistance of wires 130 (a wire 130 is a combination of a core 130' and its coating 130"). Coating 130" may include a number of layers, possibly differing from each other in chemical composition and/or porosity and/or other properties. For example, some of the layers may serve as barrier layers to prevent diffusion between a material in wires 130 and a subsequently deposited support material 120S.

Possible increase of electrical conductivity of wires 130 can be illustrated by the following examples. Suppose that right after printing (before sintering), cores 130' have porosity of 30% or more. After low-temperature sintering, the porosity may decrease to a value of 20 to 30%. (High temperature sintering, e.g. 700° C. or more for copper, can reduce the porosity even further, e.g. to about 5%). Plated coating 130" may have porosity of 10% or less, possibly less than 5%. Assuming the post-sintering core porosity of 20% and coating porosity of 10%, the coating porosity is 50% lower than the post-sintering core porosity. Assuming the post-sintering core porosity of 30% and coating porosity of 5%, the coating porosity is (30−5)/30=83% lower than the post-sintering core porosity. Other values are possible in this regard. The reduced porosity increases the electrical conductance in addition to conductance gains due to sintering.

In some embodiments, the sintering temperature for core 130' can be 70% or less of the sintering temperature for the bulk material of the nanoparticles (in absolute temperature in Kelvin (K)), and possibly 50% or less of the melting temperature if the material has a melting temperature. For example, for copper nanoparticles the sintering temperature can be 300° C. (575° K) or less at atmospheric pressure, while the bulk melting temperature is 1085° C. (1358° K) and the conventional sintering temperature is above 650° C. (i.e. above 923° K).

In some low-temperature sintering embodiments, coating 130" increases the conductance of a wire 130 by 5% or more, possibly 10% or 20% or more. These numbers are exemplary and do not limit the invention. For example, a thicker coating may provide higher conductance gains.

In some embodiments, one or more layers of coating 130" are formed by electroless plating. If substrate 210 has a conductive top surface (e.g. if the substrate is conductive or has a conductive top layer), coating 130" can be formed by electroplating; the plating voltage can be supplied to the cores 130' from a power source (not shown) connected to the edge or bottom of substrate 210. In either case, depending on the substrate material, coating 130" may or may not form on substrate 210 between the cores, as shown in FIGS. 3B.2 and 3B.1 respectively. Coating 130" can also be formed by physical vapor deposition (e.g. sputtering), chemical vapor deposition (CVD), or possibly other techniques. In some embodiments, the coating 130" includes multiple layers; one layer is made by sputtering or CVD, and a subsequent layer or layers by electroplating; the sputtered or CVD-deposited layer delivers the plating voltage and current to cores 130" even if the substrate 210 is dielectric.

In some embodiments, the coating 130" covers only the top segments of the cores. In another example, coating 130" can be formed by dipping the cores into a liquid or semisolid material to coat the cores, and then curing the material, if the cured material is conductive. Exemplary materials of this kind are solders, indium, nickel, poly(pyrrole)s, and poly (acetylene)s. The cores 130' should preferably be wettable by the liquid or semisolid material. Substrate 210 may or may not be wettable. In some embodiments, the cores are only partially dipped into the liquid or semisolid material, and the coating 130" covers only the top sections of the cores, above the desired level.

Coating 130" may at least partly fill the open pores of cores 130'.

Advantageously, the porous surface of cores 130' improves the plating speed and adhesion of coating 130" and reduces stress or strain due to the CTE mismatch between the core and the support materials.

As shown in FIG. 3C.1 (for the case of FIG. 3B.1) and FIG. 3C.2 (for the case of FIG. 3B.2), dielectric 120S is formed to encapsulate the wires 130 and cover the substrate 210. Dielectric 120S fills the area above the substrate 210 up to a certain level, possibly to the tops of wires 130 (as shown) or to a lower level, but the tops are exposed. In some embodiments, the dielectric 120S is an encapsulant (a molding compound), i.e. a flowable material (possibly gel) that can be flowed onto the substrate (e.g. by molding, or without a mold) and then cured (by heat, UV light, or some other technique) to provide a solid dielectric layer. Such encapsulant materials include polymers and other materials based on polyimides (e.g. type PI-2611 available from Dupont), or based on epoxies, silicone, polyurethane, poly-phenylene benzobisoxazole (PBO), or benzocyclobutene (BCB). Glass can be used (possibly low-melting-temperature spin-on glass), and possibly other organic and inorganic materials. These materials may be augmented with fillers that may reduce the material cost and/or help achieve desired properties with respect to resistivity, CTE, rigidity, hardness, thermal conductivity, and possibly other factors. For example, a CTE may be desirable that matches the CTE of wires 130 and/or die 110 and/or underfill or encapsulant (not shown) formed under and over the die, and/or other components.

Alternatively, dielectric 120S can be formed by PVD, CVD, or electroless or electrolytic plating, or possibly some other method or combination of methods. For example, silicon dioxide or silicon nitride can be used and can be formed by CVD.

In some embodiments, the dielectric initially covers the wires 130 but then is thinned (e.g. by etching or chemical and/or mechanical polishing, possibly blasting with abrasive particles) as needed to expose the tops of wires 130. The dielectric may or may not have a planar top surface.

Figure 2A:
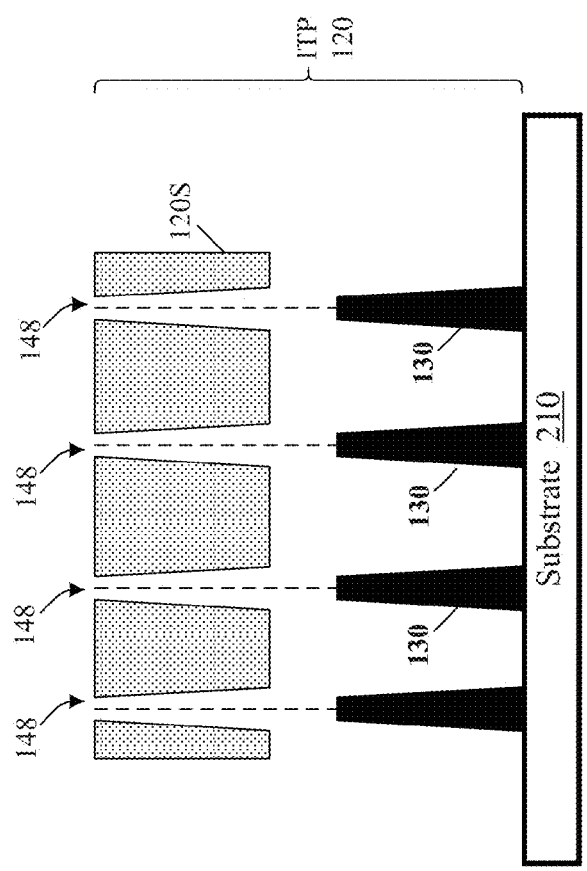
FIGS. 2A, 2B, 2C are vertical cross sections of structures with interposers in the process of fabrication according to prior art.
Figure 2B:
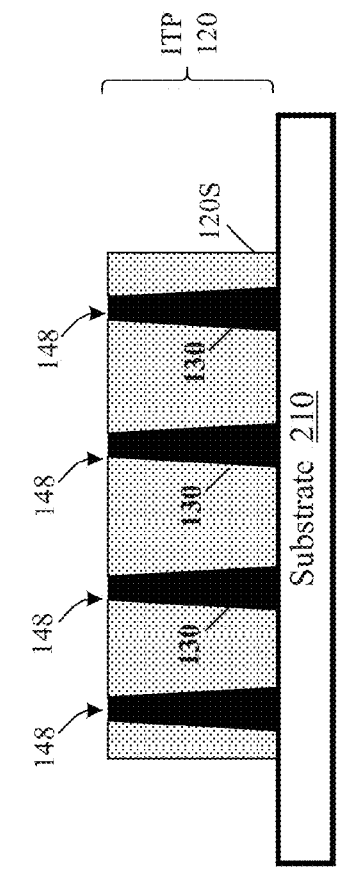
Figure 2C:
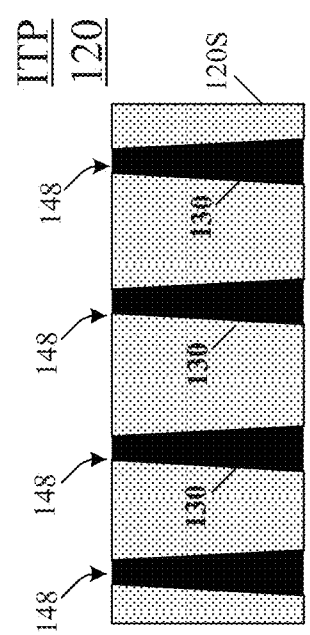

In some embodiments, support 120S is formed as in FIGS. 2A-2B, i.e. as a separate structure with a hole for each wire 130.

Figure 3D:
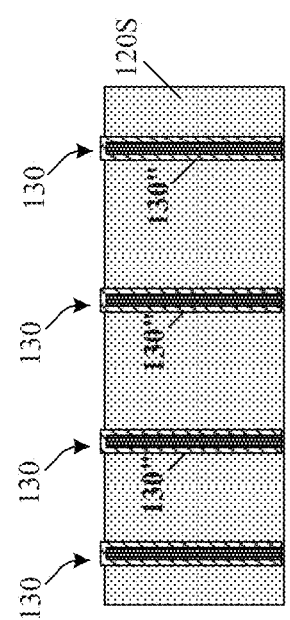
FIG. 3A.1 is a vertical cross section of a structure with an interposer in the process of fabrication according to some embodiments of the present invention.
FIGS. 3B.1, 3B.2, 3C.1, 3C.2, 3D, 4 are vertical cross sections of structures with interposers in the process of fabrication according to some embodiments of the present invention.

As shown in FIG. 3D, substrate 210 is removed. In the case of FIG. 3C.2, the coating 130" is also removed between the wires so as to electrically insulate the wires from each other. Alternatively, portions of coating 130" may be left in place between the wires to interconnect some of the wires 130. These wires may be interconnected to form desired circuitry, or perhaps these wires are not part of any circuitry but are used to enhance heat dissipation and/or mechanical strength of the interposer, and these wires can be left interconnected by layer 130" to further enhance heat dissipation and/or mechanical strength and/or other properties.

In some embodiments, the bottom surface of dielectric 120S is planar when the substrate is removed. Bottom portions of wires 130 may be removed in this process so that the wires' bottoms are coplanar with the bottom surface of dielectric 120S. Alternatively, the wires' bottoms can be recessed into, or protruding out of, the bottom surface of dielectric 120S to facilitate subsequent alignment and connection with other features (such as PCB contacts 124C shown in FIG. 1).

Removal of substrate 210, and of layer 130" between the wires in the case of FIG. 3C.2, can be performed by chemical etching, mechanical or chemical mechanical polishing (including for example grinding or milling), or any other technique or combination of techniques. In the case of FIG. 3C.2, if some of layer 130" interconnecting the wires is to be left in place, then substrate 210 can be removed first, and then layer 130" can be patterned as needed using photolithography for example. In some embodiments, substrate 210 is removed by a blanket process (without a mask), and in some embodiments in the case of FIG. 3C.2 the entire layer 130" portion between the wires 130 is also removed without a mask.

Subsequent processing can be as in prior art or of some other type. For example, in FIG. 4, RDL 140.T is formed on top of support 120S, and RDL 140.B is formed on the bottom. Contact pads 120C.T and contact pads 120C.B are formed at the top and bottom of interposer 120 respectively at the ends of lines 140L of the respective RDLs. Each RDL 140 (140.T and 140.B) includes conductive lines 140L that interconnect the wires 130 and, respectively, the top contact pads 120C.T (for RDL 140.T) or the bottom contact pads 120C.B (for RDL 140.B). Each RDL 140 may include dielectric 140D—e.g. organic dielectric, possibly a polymer (e.g. polyimide), or inorganic dielectric, e.g. silicon dioxide or silicon nitride—that electrically insulates the conductive lines 140L from each other and, possibly, from wires 130, as needed.

Chips 110 (or multichip modules) have their contact pads 110C connected to the top contact pads 120C.T. The connections are shown at 144, and can be solder, adhesive, diffusion bonding, or some other type. Discrete wires can also be used. The chips 110 can be underfilled and encapsulated by a molding compound if desired. PCB 124 has its contact pads 124C attached to contact pads 120C.B, with connections also shown at 144; these connections can be solder, adhesive, or diffusion bonding. PCB contacts 124C are interconnected by PCB interconnects 124L. Other circuits and connection types can be used to connect various circuits to contact pads 120C (i.e. 120C.T and 120C.B) as known in the art. Further, RDL 140.T or 140.B or both can be omitted; the contact pads can be provided by wires 130.

Figure 4:
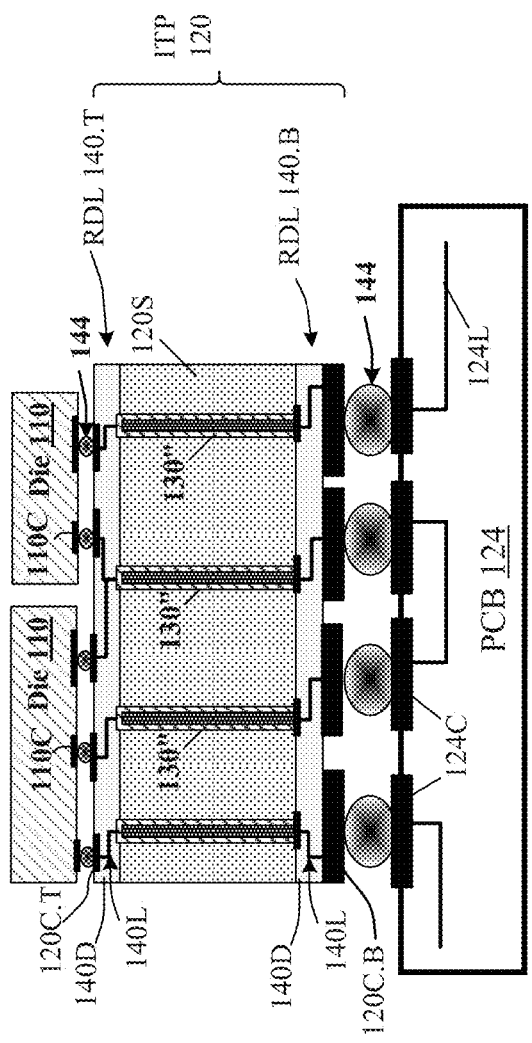

FIG. 5A illustrates a flowchart of the process described above. At step 510, cores 130' are printed as described above in connection with FIGS. 3A.1, 3A.2. At step 520, coating 130" is formed (FIG. 3B.1, 3B.2). At step 530, support 120S is formed (FIGS. 3C.1, 3C.2). At step 540, substrate 210 is removed, possibly with portions of coating 130" and/or cores 130' (FIG. 3D). At step 550, the RDLs are formed (FIG. 4). At step 560, die 110 and PCB 124 are added to the structure.

Many variations are possible. For example, removal of substrate 210 (step 540) can be postponed as shown in FIG. 5B. Here the steps 510, 520, 530 are performed in the same sequence as in FIG. 5A. Then RDL 140.T is formed (step 550A), and the die 110 are attached on top (step 560A). Substrate 210 remains in place for steps 550A and 560A, strengthening the structure. Substrate 210 is removed after the die attachment (step 540), and possibly after the die are underfilled and encapsulated by a molding compound. Bottom RDL 140.B is formed next (step 550B), followed by the PCB attachment (step 560B). Other fabrication sequences and variations are possible.

Also, after forming the support 120S, the exposed portions (the tops) of wires 130 can be plated with additional conductive material, e.g. a barrier layer (not shown) to prevent diffusion of materials of wires 130 into dielectric 140D or of the dielectric material into the wires.

In another variation, support 120S is possibly non-dielectric material, and can be a conductor or semiconductor (but can also be dielectric). Before fabrication of support 120S, the wires 130 are coated by dielectric 610 (FIG. 6A) which will separate and electrically insulate the wires from subsequently formed support 120S (FIG. 6B). In some embodiments, dielectric layer 610 is shown as substantially conformal, but this is not necessary. Dielectric 610 is removed at the top of wires 130 (e.g. by a chemical etch or mechanical polishing or bombardment by energized particles (like in PVD) or CMP or some other process) to allow the wires to be contacted by lines 140L or contact pads 110C. Dielectric coating 610 can be a thin film deposited over the wires 130 and, possibly, between the wires 130. FIGS. 6A-6C show the structure pre-processed as in FIG. 3B.1, with coating 130" being absent between the wires, but the initial structure can be as in FIG. 3B.2. If support 120S is dielectric, it can be formed using the materials and processes described above. Alternatively, support 120S can be a non-dielectric material, e.g. metal or (possibly heavily doped) silicon, made by vapor deposition or other techniques, and having good heat dissipation properties. RDL dielectric 140D can be formed on top and bottom to insulate the support 120S from lines 140L or other conductive features, and the dielectric can be patterned to expose the wires 130 and provide physical and electrical access to the wires.

The wires 130 do not have to be vertical but may be at any angle and may be curved and intersecting (i.e. branching), possibly eliminating the need for the RDLs, as shown in FIG. 7. The wires are shown as black lines, without showing the cores 130' as separate from the coating 130", but the wires can have the same structure as in FIG. 3D or 6C; dielectric 610 is not shown but may be present. In FIG. 7, wire 130.1 is vertical as in FIG. 3D. Wire 130.2 is bent. Wires 130.3 and 130.4 merge at the bottom. Wire network 130.5 includes intersecting wires. Wire 130.6 is a coil; the planar vertical cross section of FIG. 7 includes only isolated points on the left and right of the coil plus the top and bottom connecting segments; the coil is schematically shown in insert A. Any shapes and networks of wires can be present. For example, wires can be inclined to come closer together at the top than at the bottom of the interposer to accommodate the smaller pitch of the die contact pads 110C compared to PCB contact pads 124C. The wire thickness can vary within the network, e.g. the wires can be thinner at the top than at the bottom to further facilitate attachment to structures with different contact pad pitches at the top of the interposer compared to the bottom.

RDLs 140 can be formed on top and/or bottom of the interposer as in FIG. 4. However, flexibility in wire arrangements allows the wires 130 to replace one or more (possibly all) of RDL interconnect lines 140L, so the RDLs can be omitted or simplified. But RDLs can be used if desired. For example, some embodiments use RDLs because in such embodiments the conductive lines 140L can be thinner and closer to each other than wires 130.

In some embodiments, each continuous network of wires is coated by a coating such as 130" in FIG. 3D. However, the coating may cover only part of the network (due for example to limitations of the coating process—e.g. if the coating is formed by sputtering then part of the network can be shielded from the coating). In some embodiments, coating 130" is omitted. In some embodiments, the printing ink is non-nanoparticle ink, i.e. its conductive particles are larger than 1 micron in diameter. Sintering can be performed at high temperatures, i.e. same temperatures as for the corresponding bulk materials.

In FIGS. 8A, 8B, before printing step 510, a die or multi-chip module (MCM) 710 was formed on substrate 210 (any number of die or MCMs can be present). Substrate 210 may be a sacrificial substrate as described above. Module 710 may have bottom contact pads 710C.B, and possibly top contact pads 710C.T on top. Some of wires 130 (e.g. 130.1) can be formed on the top contact pads 710C.T at steps 510-520 (these wires can be NP or non-NP, coated or not with 130" and/or 610, of any configuration described above in connection with FIG. 7).

Substrate 210 is removed at step 540 (FIG. 8B). In the particular embodiment of FIG. 8B, an RDL 140.B is formed on the bottom (step 550). Module 710 has contact pads connected to the RDL's lines 140L. Other processing can be as described above (e.g. die and/or PCB attachment, with or without an RDL at the top). FIG. 8B shows a bottom RDL 140.B and connections 144 as in FIG. 4, but the RDL can be absent and other variations are possible.

Figure 9:
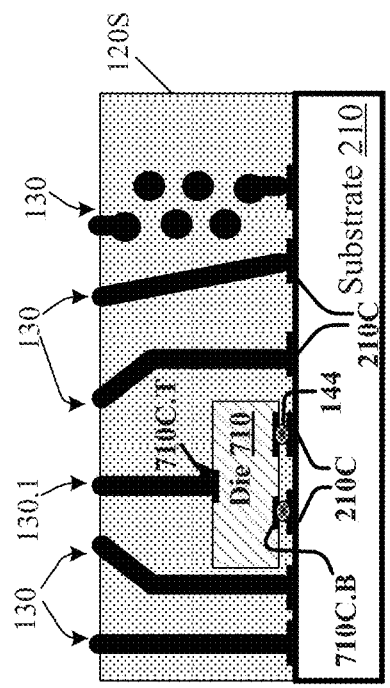

In FIG. 9, substrate 210 is a non-sacrificial, functional substrate, with circuitry (not shown except for the top contact pads 210C). Modules 710 may or may not be present. In FIG. 9, a module 710 is present, and its bottom contact pads 710C.B are attached to contact pads 210C with connections 144 (e.g. solder or other types described above). Wires 130 are formed on contact pads 210C and 710C.T. Additional features can be as described above (e.g. top RDL and die). This structure can be manufactured as described above, but step 540 is omitted. The functional substrate 210 can be another interposer as discussed immediately below.

Figure 10:
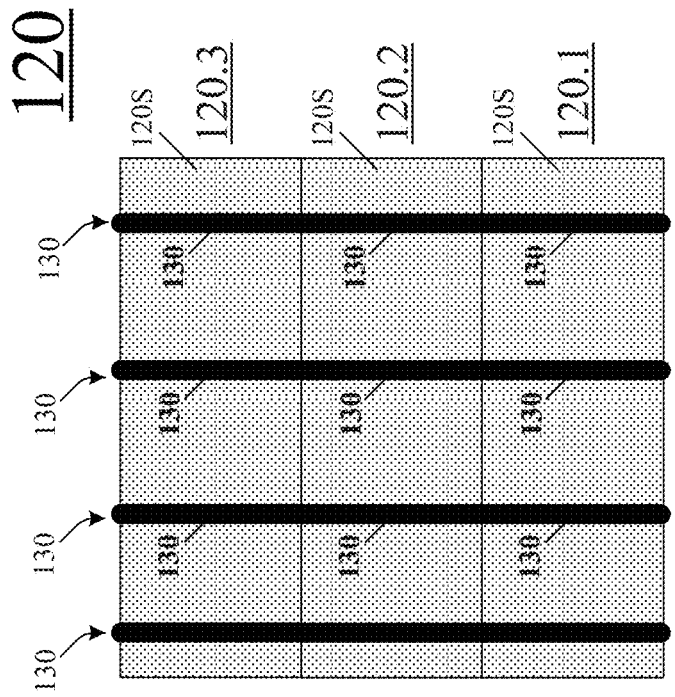

In FIG. 10, interposer 120 includes three constituent interposers 120.1, 120.2, 120.3 (any number of constituent interposers can be present). Each constituent interposer 120.$i$ ($i$=1, 2, 3) is as in FIG. 3D or 6C or some other type. In some fabrication processes, interposer 120.1 is formed on a sacrificial substrate 210 (not shown) as in FIG. 3D. The sacrificial substrate is then removed (or can be removed at a later stage). Then interposer 120.2 is formed on interposer 120.1 (i.e. interposer 120.1 serves as functional substrate 210 of FIG. 9). Then interposer 120.3 is formed on interposer 120.2 (interposers 120.1, 120.2 serve as substrate 210 of FIG. 9). Alternatively, interposer 120.2 can be formed first, then interposer 120.1, then interposer 120.3. Additional constituent interposers (not shown) can be formed on top or bottom. Of note, any structures described in this disclosure can be turned upside down or at any angle if needed in fabrication or subsequent use.

In FIG. 10, each wire 130 of interposer 120.3 is formed on top of a corresponding wire of interposer 120.2, which in turn is formed on top of a corresponding wire of interposer 120.1, resulting in triple-height (and triple aspect ratio) wires. Before forming the wires 130 of interposer 120.2, the wires of interposer 120.1 are encapsulated by corresponding support 120S and are therefore mechanically stable. Likewise, the wires of interposer 120.2 are encapsulated by corresponding support 120S before formation of wires 130 of interposer 120.3. The mechanical stability facilitates fabrication of high aspect ratio wires.

Figure 11:
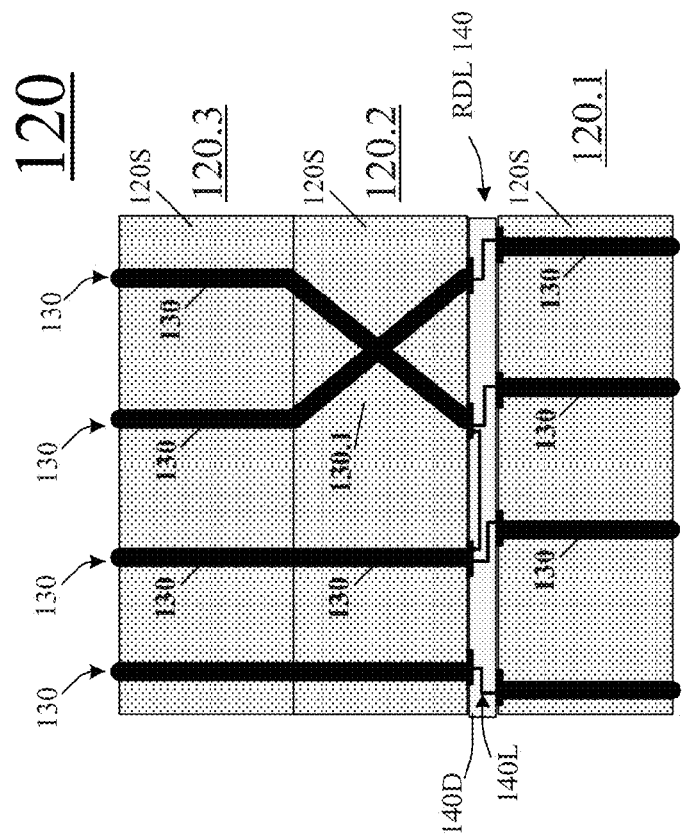

RDLs 140 can be formed between the constituent interposers as illustrated in FIG. 11—an RDL is formed between interposers 120.1 and 120.2. The RDL's lines 140L interconnect the bottoms of wires 130 of interposer 120.2 and the tops of wires 130 of interposer 120.1 in any desired manner. For example, interposer 120.1 can be formed first with the RDL, then interposer 120.2 can be formed on top; or interposer 120.2 can be formed first with the RDL, then interposer 120.1 can be added at the bottom.

Also, a constituent interposer 120.i may include a module like 710 in FIGS. 8A-9. Other variations described above for a non-stacked interposer can be present in stacked interposers.

Different constituent interposers may have respective different structure in the same interposer 120. For example, in FIG. 11, interposer 120.2 includes an X-shaped network of wires 130.1, but interposers 120.1 and 120.3 may have only vertical wires. Some but not all interposers may include a dielectric coating 610 (FIGS. 6A-6C) on their wire structures. Different materials can be used for different constituent interposers. The constituent interposers may differ in thickness, in the pitch between conductive features 130, and other properties.

Figure 12:
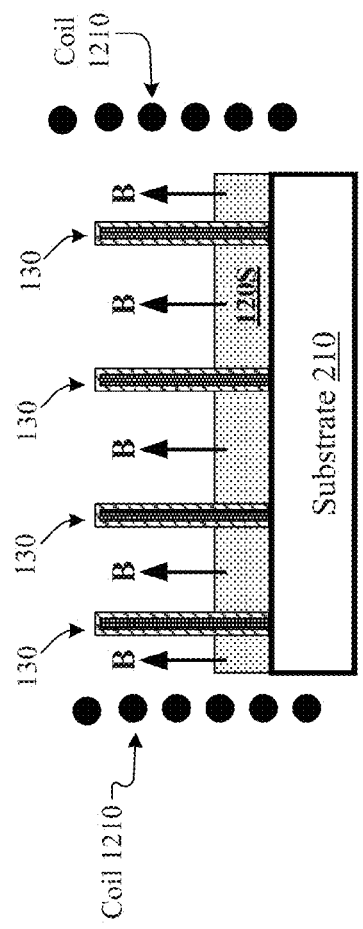

To stabilize the wires 130 during fabrication of support 120S, magnetic fields can be used as shown in FIG. 12. Here the interposer 120 is as in FIG. 3B.1, but other interposer structures described above can be used. The structure is shown during fabrication of support 120S, which has been partially formed. Wires 130 include magnetic material present in the wire cores 130' and/or coating 130", and/or there is magnetic material in coating 610 (FIG. 6B). In this embodiment, the wires are kept in vertical position by a vertical magnetic field B. The field is directed upward, but can be directed downward. The field is created by an electric current through a coil (solenoid) 1210 wound around the wires. The field could be created in any other suitable way, e.g. by permanent magnets above and below the interposer. The field is generated since before the start of deposition of support material 120S, and the field can be maintained as long as needed, possibly through the end of the deposition.

The magnetic field can also be used for the fabrication process shown in FIGS. 2A-2B, or for other processes.

In some embodiments, the wires are designed to be sloped (non-vertical), and the field B is generated to keep the wires at the desired angle. Also, in some embodiments, different wires have different angles, but some wires are thicker and stronger (more stable) than others, and the field B is directed to stabilize the weaker wires even though the field may be transverse (angled) relative to the stronger wires. Further, in some embodiments, the field B helps stabilize curved wires. For example, in case of coil 130.6 in FIG. 7, a vertical field B helps keep the coil in the upright position.

The field B may have different directions at different parts of the interposer to point different wires 130 at different angles in the same interposer.

The magnetic field can stabilize the wires in other manufacturing processes, e.g. in forming the coating 130" (FIGS. 3B.1 and 3B.2) or dielectric coating 610. Indeed, when the coating 130" or 610 is being formed, the wires 130 may undesirably bend out of shape, and this may negatively affect the coating uniformity. For example, if the coating is formed by sputtering, then a bent wire may shield part of an adjacent wire or part of its own surface from the sputtered material. The magnetic field helps keep the wires in a desired shape during the manufacturing process.

The magnetic field can be used in this way with wires 130 formed as described above or other types of wires, e.g. from nanoparticle inks or by other methods, with or without coating 130" and/or coating 610, e.g. bond wires as in the aforementioned Caskey et al. US 2014/0036454 publication, or possibly of other kinds.

In some embodiments, the magnetic field is strong enough to change the angular orientation of at least part of a wire by at least 1°, or at least 5°, or at least 10°.

Suitable magnetic materials for wires 130 (e.g. for cores 130' and coatings 130" or for the bond wires) include ferromagnetic materials such as iron, cobalt, and nickel, and ferrimagnetic materials such as ferrites and magnetic garnets. The content of these materials in a wire can be less than 100%, e.g. can be in the range of 3 to 99% by weight. The field B may or may not be uniform.

A magnetic field can be used at other fabrication stages, e.g. during the deposition of coating 130" (FIGS. 3B.1, 3B.2) or coating 610 (FIG. 6A), to stabilize the wires 130 or cores 130' if they contain magnetic materials.

The invention is not limited to the embodiments discussed above. Some embodiments are defined by the following clauses.

Clause 1 defines a method for manufacturing a structure comprising an interposer comprising:

a support; and interconnection circuitry passing through the support to interconnect circuits above and below the interposer (interconnection circuitry may include wires 130, and may include RDL lines 140L; the interposer may or may not include any RDLs; the interposer may or may not include a module 710), the interconnection circuitry comprising one or more electrically conductive features (e.g. 130);

the method comprising:

(1) forming at least part of the interconnection circuitry on a substrate, said at least part of the interconnection circuitry comprising a core portion (e.g. 130', the core portion may include multiple cores of multiple wires) and an electrically conductive layer (e.g. 130") overlaying at least part of the core portion and substantially conforming to the core portion, wherein forming the at least part of the interconnection circuitry comprises:

depositing ink onto the substrate, the ink comprising conductive nanoparticles carried by a non-gaseous fluid carrier (i.e. liquid or semi-solid carrier), the conductive nanoparticles joining together to form the core portion, the core portion comprising one or more elongated segments above the substrate (e.g. each elongated segment may be part of a core 130' above the substrate, e.g. the middle of the core of a wire 130 or any other portion of the core; different elongated segments may be different parts of a core 130' or parts of different cores 130'); and forming the electrically conductive layer over at least said part of the core portion to increase the electrical conductance of at least one conductive feature, the electrically conductive layer covering an entire longitudinal surface of each elongated segment;

(2) forming the support that fills, at least up to a level above each elongated segment, a region above the substrate around each elongated segment, the support not completely covering said at least part of the interconnection circuitry to allow at least each elongated segment to be electrically contacted from above the support.

Clause 2 defines the method of clause 1 further comprising, after forming the support, removing at least part of the substrate to enable at least one elongated segment to be electrically contacted from below the support.

Clause 3 defines the method of clause 2 wherein removing said at least part of the substrate exposes the interconnection circuitry at a bottom of the support.

Clause 4 defines the method of clause 2 wherein removing said at least part of the substrate comprises removing the substrate.

Clause 5 defines the method of clause 1 wherein forming the support comprises dispensing and curing a non-gaseous fluid material (e.g. encapsulant) at least a portion of which forms the support when cured.

Clause 6 defines the method of clause 1 wherein the electrically conductive layer increases conductance of at least one elongated segment by at least 5%.

Clause 7 defines the method of clause 1 wherein the electrically conductive layer has a lower porosity than the porosity of at least one elongated segment immediately before forming the electrically conductive layer. Of note, the core porosity may be reduced by the electrically conductive layer getting into the core pores.

Clause 8 defines the method of clause 7 wherein the porosity of the electrically conductive layer is lower than the porosity of said at least one elongated segment immediately before forming the electrically conductive layer by at least 50%.

Clause 9 defines the method of clause 1 further comprising, after forming the electrically conductive layer but before forming the support, forming a dielectric layer over the electrically conductive layer over each elongated segment.

Clause 10 defines the method of clause 9 wherein the support is not dielectric, and the dielectric layer electrically insulates each elongated segment from the support.

Clause 11 defines the method of clause 1 wherein the support is dielectric.

Clause 12 defines the method of clause 1 wherein the elongated segment comprises a coil.

Clause 13 defines the method of clause 12 wherein the coil comprises at least two full turns.

Clause 14 defines the method of clause 1 further comprising, after forming the support, forming dielectric and conductive layers on the support to form circuitry above the support (e.g. to form the RDL), the circuitry above the support being part of the interconnection circuitry.

Clause 15 defines the method of clause 1 wherein:
the core portion comprises a plurality of spaced apart electrically conductive core features (e.g. cores 130'); and
the electrically conductive layer is formed by electroplating when the core features are electrically connected to a source of electric power through an electrically conductive region interconnecting the core features (e.g. through substrate 210 or a layer sputtered over the cores 130').

Clause 16 defines the method of clause 15 wherein the electrically conductive region comprises at least part of the substrate.

Clause 17 defines the method of clause 15 wherein the electrically conductive region comprises a layer formed over the core features.

Clause 18 defines the method of clause 1 wherein at least part of the interconnection circuitry formed before forming the support comprises magnetic material, and wherein the magnetic material is placed in a magnetic field during interposer manufacturing to stabilize at least part of the interconnection circuitry. For example, the whole interconnection circuitry can be made of a magnetic material. In another example, the interconnection circuitry comprises magnetic particles mixed with conductive nanoparticles or present in a coating such as 130" or 610. In another example, coating 130" and/or 610 is made entirely of a magnetic material, and/or an additional coating is provided made entirely or partly of a magnetic material.

Clause 19 defines the method of clause 18 wherein the magnetic material is in the magnetic field during forming at least part of the support.

Clause 20 defines a structure comprising an interposer comprising:
a support; and
interconnection circuitry passing through the support and operable to interconnect circuits above and below the interposer, the interconnection circuitry comprising:
one or more first contact pads at a top of the interposer (e.g. pads 120C.T);
one or more second contact pads at a bottom of the interposer (e.g. 120C.B); and
one or more electrically conductive features interconnecting the first and second contact pads in a desired pattern;
wherein the one or more electrically conductive features comprise:
one or more porous elongated segments underlying a top surface of the support; and
for each elongated segment, an electrically conductive layer covering an entire longitudinal sidewall of the elongated segment and substantially conforming to the longitudinal sidewall of the elongated segment, the electrically conductive layer having a lower porosity than the elongated segment.

Clause 21 defines the structure of clause 20 wherein the support is made of a molding compound.

Clause 22 defines the structure of clause 20 wherein the electrically conductive layer increases conductance of at least one elongated segment by at least 5%.

Clause 23 defines the structure of clause 20 wherein each elongated segment comprises a porous matrix made of a first conductive material, and the electrically conductive layer is made of a second material different from the first material, and the porosity of the electrically conductive layer is lower than the porosity of the porous matrix by at least 50%.

Clause 24 defines the structure of clause 20 further comprising a dielectric layer over the electrically conductive layer of each elongated segment, the dielectric layer substantially conforming to the longitudinal surface of each elongated segment.

Clause 25 defines the structure of clause 24 wherein the support is not dielectric, and the dielectric layer electrically insulates each elongated segment from the support.

Clause 26 defines the structure of clause 20 wherein the support is dielectric.

Clause 27 defines the structure of clause 20 wherein elongated segment comprises a coil.

Clause 28 defines the structure of clause 27 wherein the coil comprises at least two full turns.

Clause 29 defines the structure of clause 20 comprising dielectric and conductive layers on the support that comprise circuitry above the support, the circuitry above the support being part of the interconnection circuitry.

Clause 30 defines a manufacturing method comprising:

forming a structure comprising one or more conductive features on a substrate, the one or more conductive features comprising ferromagnetic or ferrimagnetic material;

placing the one or more conductive features in a magnetic field to stabilize a position of the one or more conductive features; and applying a manufacturing process to the structure when the conductive features being stabilized by the magnetic field.

Clause 31 defines the method of clause 30 wherein the manufacturing process comprises forming at least part of a support on the substrate, the support laterally surrounding each conductive feature and stabilizing the position of each conductive feature.

Clause 32 defines the method of clause 30 wherein the manufacturing process comprises forming at least part of a conformal layer over each conductive feature.

Clause 33 defines the method of clause 30 wherein the magnetic field changes an angular orientation of at least one conductive feature by an angle of at least 1°.

Clause 34 defines the method of clause 30 the angle is at least 5°.

The invention is not limited to the embodiments described above. Other embodiments and variations are within the scope of the invention, as defined by the appended claims.

The invention claimed is:

1. A manufacturing method comprising:
   (1) forming at least part of interconnection circuitry, said at least part of the interconnection circuitry comprising a core portion and an electrically conductive layer overlaying at least part of the core portion and substantially conforming to the core portion, wherein forming the at least part of the interconnection circuitry comprises:
   depositing ink onto a substrate, the ink comprising conductive nanoparticles carried by a non-gaseous fluid carrier, the conductive nanoparticles joining together to form the core portion, the core portion comprising one or more elongated segments above the substrate; and
   forming the electrically conductive layer over at least said part of the core portion to increase the electrical conductance of at least one conductive feature, the electrically conductive layer covering an entire longitudinal surface of each elongated segment;
   (2) forming a support that fills, at least up to a level above each elongated segment, a region above the substrate around each elongated segment, the support not completely covering said at least part of the interconnection circuitry to allow at least each elongated segment to be electrically contacted from above the support;
   wherein the interconnection circuitry comprises one or more electrically conductive features passing through the support to interconnect circuits from a first side of the support to a second side of the support.

2. The method of claim 1 further comprising, after forming the support, removing at least part of the substrate to enable at least one elongated segment to be electrically contacted from below the support.

3. The method of claim 1 wherein the electrically conductive layer has a lower porosity than the porosity of at least one elongated segment immediately before forming the electrically conductive layer.

4. The method of claim 3 wherein the porosity of the electrically conductive layer is lower than the porosity of said at least one elongated segment immediately before forming the electrically conductive layer by at least 50%.

5. The method of claim 1 further comprising, after forming the electrically conductive layer but before forming the support, forming a dielectric layer over the electrically conductive layer over each elongated segment.

6. The method of claim 5 wherein the support is not dielectric, and the dielectric layer electrically insulates each elongated segment from the support.

7. The method of claim 1 further comprising, after forming the support, forming dielectric and conductive layers on the support to form circuitry above the support, the circuitry above the support being part of the interconnection circuitry.

8. The method of claim 1 wherein:
   the core portion comprises a plurality of spaced apart electrically conductive core features; and
   at least part of the electrically conductive layer is formed by electroplating when the core features are electrically connected to a source of electric power through an electrically conductive region interconnecting the core features.

9. The method of claim 8 wherein the electrically conductive region comprises at least part of the substrate.

10. The method of claim 8 wherein the electrically conductive region comprises a layer formed over the core features.

* * * * *